(12) United States Patent
Gerhardt et al.

(10) Patent No.: US 9,219,013 B2
(45) Date of Patent: Dec. 22, 2015

(54) TECHNIQUE FOR MANUFACTURING SEMICONDUCTOR DEVICES COMPRISING TRANSISTORS WITH DIFFERENT THRESHOLD VOLTAGES

(71) Applicant: GLOBALFOUNDRIES Inc., Grand Cayman (KY)

(72) Inventors: Martin Gerhardt, Dresden (DE);
Stefan Flachowsky, Dresden (DE);
Matthias Kessler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 436 days.

(21) Appl. No.: 13/799,239

(22) Filed: Mar. 13, 2013

(65) Prior Publication Data
US 2014/0273370 A1 Sep. 18, 2014

(51) Int. Cl.
*H01L 21/8238* (2006.01)
*H01L 21/265* (2006.01)
*H01L 29/66* (2006.01)
*H01L 29/10* (2006.01)
*H01L 21/8234* (2006.01)

(52) U.S. Cl.
CPC ...... *H01L 21/8238* (2013.01); *H01L 21/26506* (2013.01); *H01L 21/26513* (2013.01); *H01L 21/823412* (2013.01); *H01L 21/823418* (2013.01); *H01L 21/823807* (2013.01); *H01L 21/823814* (2013.01); *H01L 29/1083* (2013.01); *H01L 29/6659* (2013.01); *H01L 21/26586* (2013.01)

(58) Field of Classification Search
CPC .................................................. H01L 21/8238
See application file for complete search history.

(56) References Cited

U.S. PATENT DOCUMENTS

| | | | | |
|---|---|---|---|---|
| 2004/0203197 A1* | 10/2004 | Chang | ............. | H01L 21/823807 438/199 |
| 2008/0179692 A1* | 7/2008 | Chun | ............. | H01L 27/105 257/391 |
| 2009/0057779 A1* | 3/2009 | Jang | ............. | H01L 21/823412 257/392 |
| 2013/0095630 A1* | 4/2013 | Eshun | ............. | H01L 21/823412 438/302 |

* cited by examiner

*Primary Examiner* — Marvin Payen
(74) *Attorney, Agent, or Firm* — Amerson Law Firm, PLLC

(57) ABSTRACT

When forming semiconductor devices including transistors with different threshold voltages, the different threshold voltages of transistors of the same conductivity type are substantially defined by performing different halo implantations. As the other implantations performed typically in the same manufacturing step, such as pre-amorphization, source and drain extension implantation and extra diffusion engineering implantations, may be identical for different threshold voltages, these implantations, in addition to a common halo base implantation, may be performed for all transistors of the same conductivity type in a common implantation sequence. Higher threshold voltages of specific transistors may be subsequently achieved by an additional low-dose halo implantation while the other transistors are covered by a resist mask. Thus, the amount of atoms of the implant species in the required resist masks is reduced so that removal of the resist masks is facilitated. Furthermore, the number of implantation steps is decreased compared to conventional manufacturing processes.

16 Claims, 7 Drawing Sheets

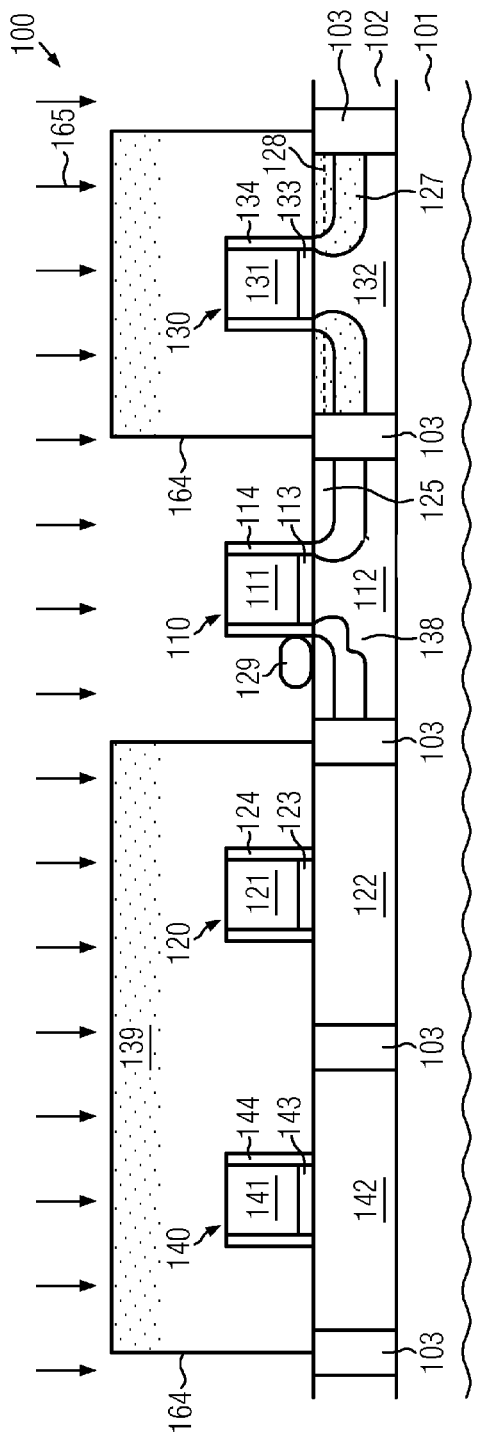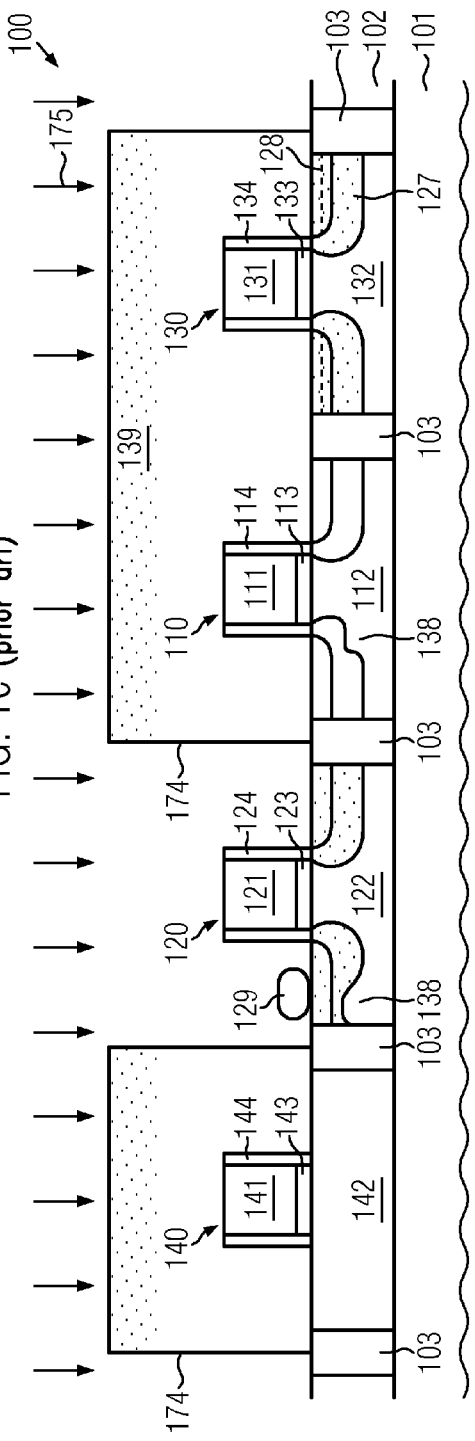
FIG. 1c (prior art)
FIG. 1d (prior art)

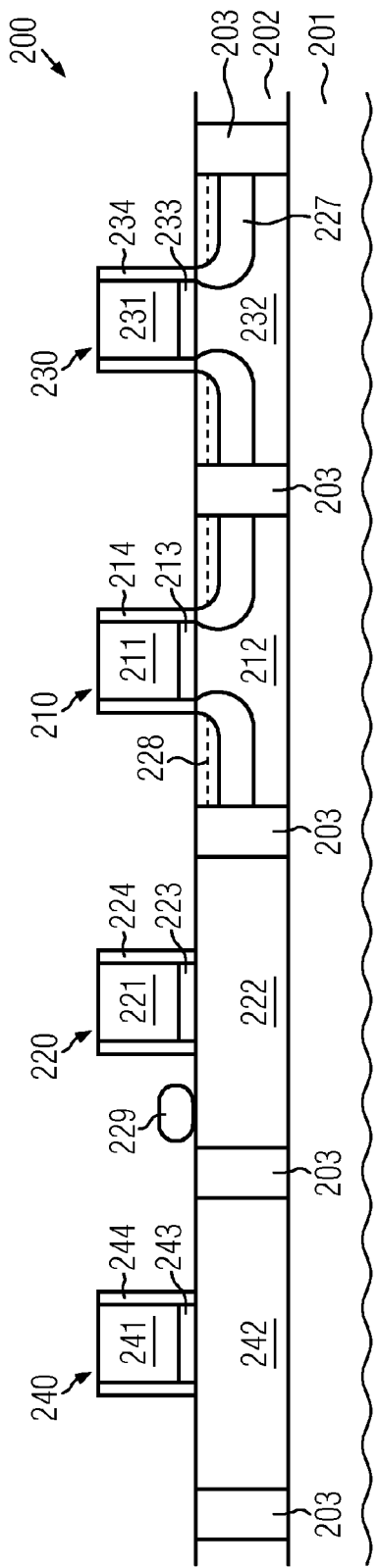
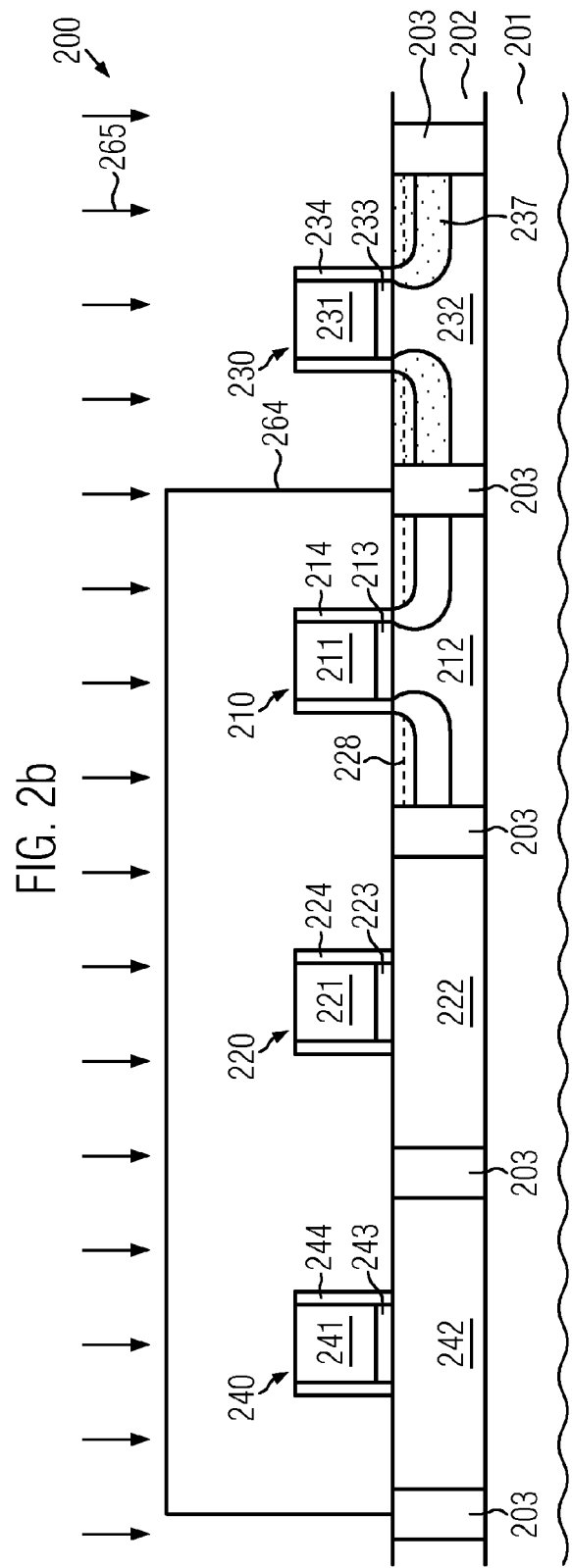

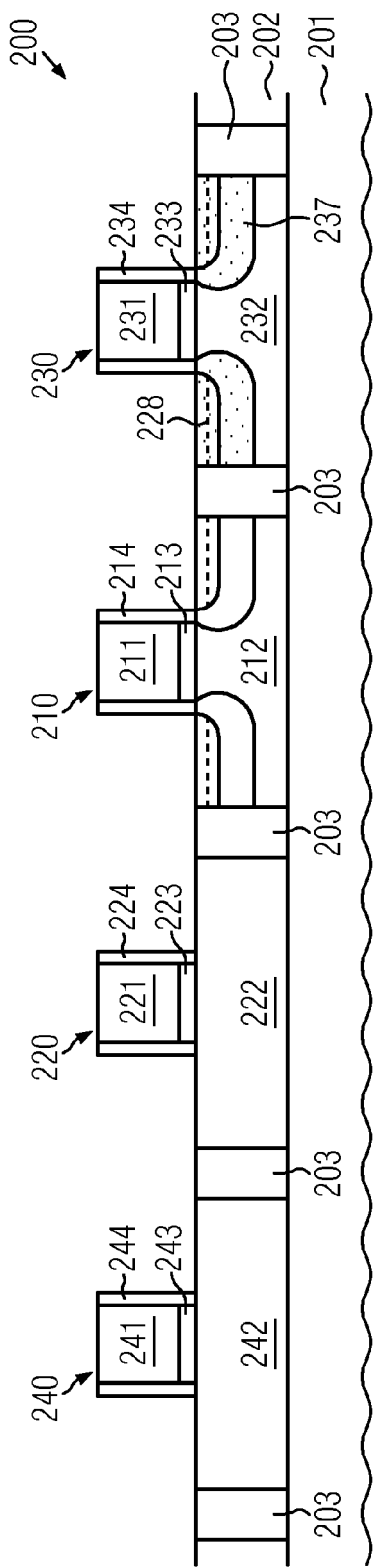
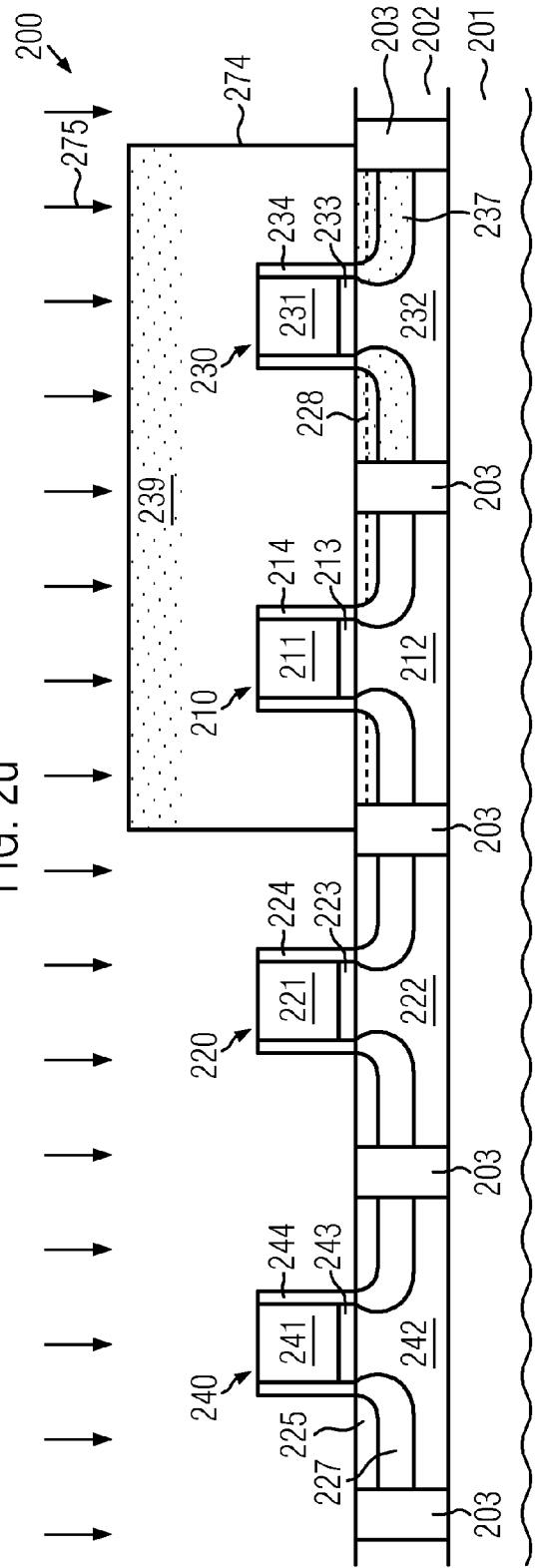
FIG. 2d
FIG. 2e

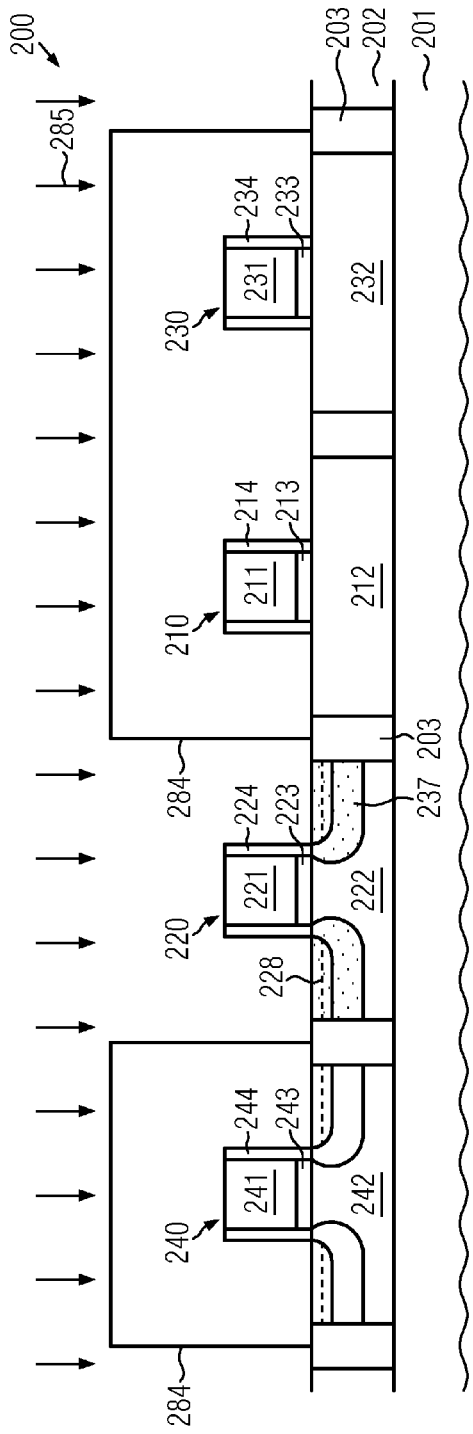
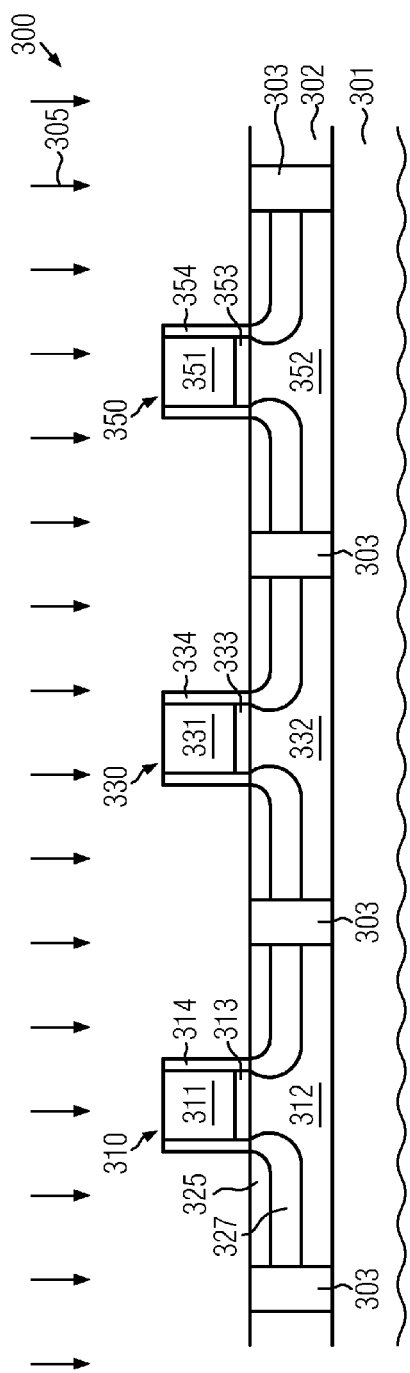

TECHNIQUE FOR MANUFACTURING SEMICONDUCTOR DEVICES COMPRISING TRANSISTORS WITH DIFFERENT THRESHOLD VOLTAGES

BACKGROUND OF THE INVENTION

1. Field of the Invention

The present disclosure generally relates to the fabrication of integrated circuits, and, more particularly, to the fabrication of highly sophisticated field effect transistors, such as MOS transistors, requiring highly doped shallow junctions formed on the basis of resist masks to provide transistors with different threshold voltages in a semiconductor device.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling of transistor elements, such as MOS transistor elements, to provide the great number of transistor elements that may be necessary for producing modern logic and memory devices. One important aspect in manufacturing field effect transistors having reduced dimensions is the reduction of the length of the gate electrode that controls the formation of a conductive channel separating the source and drain regions of the transistor element. The source and drain regions of the transistor element are conductive semiconductor regions including dopants of an inverse conductivity type compared to the dopants in the surrounding crystalline active region, e.g., a substrate or a well region.

Although the reduction of the gate length is beneficial for obtaining smaller and faster transistor elements, it turns out, however, that a plurality of issues are additionally involved to maintain proper transistor performance for a reduced gate length. One challenging task in this respect is the provision of shallow junction regions, i.e., source and drain regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence so as to obtain a high dopant concentration having a profile that varies laterally and in depth.

Generally, the ion implantation process is a viable technique for introducing certain dopant species, such as P-type dopants, N-type dopants and the like, into specified device areas, which are usually defined by appropriate implantation masks, such as resist masks and the like. During the definition of active transistor regions, such as P-wells and N-wells, and during the formation of the actual drain and source dopant profiles, respective resist masks are typically provided to selectively expose and cover the device areas so as to introduce the required type of dopant species. That is, the respective implant species is introduced into non-covered device portions while the resist material blocks the dopant species and prevents dopant penetration into covered device portions, wherein the average penetration depth is determined by the implantation energy for a given implant species and a given material composition of the device area, while the dopant concentration is determined by the implantation dose and the implantation duration. Thereafter, the resist mask is removed and a further implantation process may be performed according to device requirements, e.g., for transistors with different threshold voltages on the basis of a newly formed resist mask. Hence, a plurality of implantation processes are to be performed during the formation of transistor elements, thereby also requiring a plurality of resist removal processes. Due to the demand for extremely shallow junctions, i.e., source and drain dopant profiles, in particular in portions located in the vicinity of the channel region, which are also referred to as source and drain extensions, moderately low implantation energies at high doses are to be used, thereby resulting in specific difficulties during the resist removal process, in particular in devices comprising transistors with different threshold voltages as the high-dose implantation and the removal process has to be performed repeatedly, as will be described with reference to FIGS. 1a-1e in more detail.

FIG. 1a schematically illustrates a cross-sectional view of a semiconductor device 100 in a manufacturing stage in which gate electrode structures 110, 120, 130, 140 may be provided with lateral dimensions of, for instance, 50 nm and less. In this manufacturing stage the device 100 typically comprises a substrate 101 in combination with a semiconductor layer 102, such as a silicon layer, in which a plurality of active regions 112, 122, 132, 142 are provided. Generally, an active region is to be understood as a semiconductor region of the layer 102 in and above which one or more transistors have to be formed. In FIG. 1a, the active regions 122, 142 represent the active regions of P-channel transistors, and the active regions 112, 132 represent the active regions of N-channel transistors. The active regions 112, 122, 132, 142 are laterally delineated by an appropriately dimensioned and shaped isolation structure 103, for instance provided in the form of a shallow trench isolation. The gate electrode structures 120, 140 may represent gate electrode structures of the P-channel transistors to be formed in and above the active regions 122, 142 while the gate electrode structures 110, 130 represent gate electrode structures of the N-channel transistors to be formed in and above the active regions 112, 132. In the manufacturing stage shown, the gate electrode structures 110, 120, 130, 140 comprise a gate dielectric material 113, 123, 133, 143, respectively, which may have incorporated therein a gate dielectric material comprising silicon oxide, silicon oxynitride and/or high-k dielectric materials, such as hafnium oxide, hafnium silicate, zirconium oxide and the like. The high-k dielectric materials may be implemented so as to provide a total dielectric constant that is 10.0 and higher. Furthermore, a metal-containing electrode material (not shown), such as titanium nitride and the like, is typically provided in combination with the high-k dielectric material in order to obtain the required threshold voltage characteristics and the like. It should be noted, however, that the materials in the gate electrode structures 110, 130 on the one hand, and in the gate electrode structures 120, 140 on the other hand, may differ in their material composition, for instance with respect to a work function metal species, since typically different work functions are required for the gate electrode structures of transistors of different conductivity type. Furthermore, a silicon-based electrode material 111, 121, 131, 141 is provided in combination with a dielectric cap layer (not shown) or cap layer system, for instance comprising silicon nitride, silicon dioxide and the like. Furthermore, a spacer structure 114, 124, 134, 144, for instance comprised of one or more silicon nitride layers and the like, are formed on sidewalls of the electrode materials 111, 121, 131, 141 and the sensitive materials 113, 123, 133 143 in the gate electrode structures 110, 120, 130, 140. Additionally, a resist mask 104 is formed above the active regions 112, 122, 142.

The device 100 as shown in FIG. 1a may be formed on the basis of the following process strategy. The isolation structure 103 is formed by applying sophisticated lithography, etch, deposition, anneal and planarization techniques in order to form trenches and fill the trenches with an appropriate dielectric material, thereby also defining the lateral size and shape of the active regions 112, 122, 132, 142. After incorporating any dopant species in accordance with the overall device requirements, the gate electrode structures 110, 120, 130, 140 are formed, which may require complex deposition and patterning processes in order to provide the gate materials for the various transistor types. That is, since typically different work function metal species have to be provided for transistors of different conductivity type, a corresponding deposition, masking and patterning regime is applied in this manufacturing stage. Subsequently the gate layer stack is patterned by using sophisticated lithography and etch strategies, thereby finally obtaining the gate electrode structures 110, 120, 130, 140 with the desired critical dimensions, i.e., with a gate length of 50 nm and significantly less in sophisticated applications. Next, a spacer layer is deposited followed by the etching of the spacer layer in order to obtain the spacer elements 114, 124, 134, 144 of the gate electrode structures 110, 120, 130, 140. It should be appreciated that the spacer structures may be used for confining sensitive gate materials in particular when high-k materials are used and may also act as offset spacer elements for appropriately defining the lateral and vertical dopant profiles in the active region 132 and in further advanced manufacturing stages in the active regions 112, 122, 142.

At the manufacturing stage depicted in FIG. 1a, the active regions 112, 122, 142 representing transistors with different threshold voltages are covered by a resist mask 104 and a high-dose implantation sequence 105 is performed that may comprise a pre-amorphization, a source and drain extension implantation, extra diffusion engineering implantations and halo implantations to define source and drain extension regions 125 and halo regions 127 in the active region 132. The halo regions 127 may be provided with a dopant profile appropriate for adjusting the desired threshold voltage of the transistor to be formed in and above the active region 132. During the high-dose implantation steps of the implantation sequence 105, an implant region 139 exhibiting a high concentration of the implanted species is formed in an upper region of the resist mask 104, in particular due to the low-energy of the source and drain extension implantation process.

FIG. 1b schematically illustrates the device 100 in a further advanced process stage in which the resist mask 104 (FIG. 1a) is removed from the active regions 112, 122 and 142. A resist strip process is performed in order to remove the resist mask 104, wherein the removal process may be configured as a plasma process based on, e.g., oxygen, and a further reactive component, such as fluorine in the form of carbon hexafluoride, in order to etch through the implant region 139 of the resist mask 104. During the removal process, exposed surface portions within the active region 132 may be damaged by the reactive components contained in the ambient of the removal process, thereby resulting in a significant material removal as indicated by the dashed line 128. For instance, carbon fluoride is well known to remove silicon, silicon dioxide and the like during a corresponding plasma-based process, which may thus result in a significant amount of material loss in respective exposed device areas, which may impose significant issues during further manufacturing stages with respect to appropriately adjusting the overall transistor characteristics, in particular when highly scaled devices are considered. For example, a material loss of up to a thickness of approximately 2 nm may occur during the removal process and subsequent chemical cleaning processes for removing any residuals 129 of the resist mask 104. An according material loss is in general not acceptable for devices of technologies of 45 nm and beyond. In particular, the significant material loss of exposed device areas may not only result in corresponding thickness fluctuations, depending on the specific process conditions in various device regions, but may also result in a significant loss of dopants, thereby directly influencing the transistor performance. Thus, the resist strip process is typically adjusted with regard to the amount of material removed in the active regions by reducing the duration of plasma and chemical cleaning processes to achieve only a moderate material loss which is acceptable with regard to device performance and production yield.

As a consequence, due to the reduced duration of the plasma and chemical cleaning processes, the number of residuals 129 remaining on the substrate surface may increase so that subsequent process steps, such as, e.g., further implantation steps, may be adversely affected. Thus, the resist removal process is optimized to obtain a moderate material loss and a low count of resist residuals resulting in an acceptable device performance and production yield.

FIG. 1c schematically illustrates the device 100 in a further advanced manufacturing stage wherein a further implantation sequence 165 is performed to provide an appropriate dopant profile in the active region 112, representing a transistor of the same conductivity type (N-type) as the active region 132 but with a different threshold voltage. A resist mask 164 covering the active regions 122, 132, 142 and exposing the active region 112 is formed. The implantation sequence 165 that may again comprise a pre-amorphization, a source and drain extension implantation, extra diffusion engineering implantations and one ore more halo implantation steps to define source and drain extension regions 125 and halo regions 127 in the active region 112 is performed. The halo regions 127 may be provided with a dopant profile appropriate for adjusting the desired different threshold voltage of the transistor to be formed in and above the active region 112. During the implantation sequence 165, the resist residuals 129 may negatively influence, e.g., the obtained dopant profile so that an implant modification 138 may occur. During the further high-dose implantation steps of the implantation sequence 165, a corresponding implant region 139 is also formed in the upper portion of resist mask 164. Consequently, removal of the resist mask 164 is also impeded as described with reference to resist mask 104 of FIG. 1a. Thus, due to the additional high-dose implantation sequence 165 and the additional impeded resist removal step performed to provide transistors with a different threshold voltage, the performance of the resulting device 100 and the achieved production yield may be further deteriorated.

FIG. 1d schematically illustrates the device 100 after removal of the resist mask 164 (FIG. 1c). A further resist mask 174 is formed covering the active regions 112, 132, 142 and exposing the active region 122 during a further high-dose implantation sequence 175 performed to provide an appropriate dopant profile in the active region 122, representing a transistor of a different conductivity type, such as a P-channel transistor. Due to the additional high-dose implantation sequence 175 and the additional resist removal step performed to provide transistors of a different conductivity type, the performance of the resulting device 100 and the achieved production yield may be further deteriorated.

FIG. 1e schematically illustrates the device 100 after removal of the resist mask 174 (FIG. 1d). A further resist mask 184 is formed covering the active regions 112, 122, 132 and exposing the active region 142 during a further high-dose implantation sequence 185 performed to provide an appropriate dopant profile in the active region 142, representing a P-channel transistor with a different threshold voltage. Subsequently, the resist mask 184 may be removed and, as discussed with regard to FIG. 1*b*, the removal of the resist mask 184 may also be impeded due to the atoms incorporated in the implant region 139 by the performed high-dose implantation processes.

Consequently, each additional high-dose implantation step requiring an additional resist mask increases the amount of residuals which may adversely affect the performance of the finally obtained device. Thus, for example, in CMOS devices comprising three different threshold voltages, such as, e.g., typical low, standard and high threshold voltages, the device performance may be substantially influenced, in particular when devices comprising transistors with a gate length of 50 nm and less are formed.

In view of the above-described situation, a need exists for an enhanced technique for reducing the number of defects caused by residuals of removed resist materials during various manufacturing stages in forming highly scaled semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques for reducing the number of defects in devices comprising transistors with different threshold voltages. A reduced defectivity may be achieved by performing a common base implantation sequence for different transistors of the same conductivity type and providing additional add-on implantations selectively in some of the transistors to provide transistors having a different characteristic, such as a different threshold voltage or any other different dopant profile. The employment of an add-on implantation process may reduce the amount of ions implanted in the employed resist masks so that removal of the resist masks may be facilitated so that less residuals of the resist, that may adversely affect subsequent manufacturing processes, remain on the device after resist removal and the undesired material loss in device regions may also be reduced or at least not increased. Thus, subsequently performed manufacturing process steps may be performed more reliably so that the number of defects may be reduced and the production yield may be increased.

One illustrative method of forming field effect transistors with different threshold voltages includes forming a first gate electrode structure on a first semiconductor region and a second gate electrode structure on a second semiconductor region. The method further includes performing a first implantation sequence including at least a source and drain extension implantation and a first halo implantation in the first and second semiconductor regions. The method further includes forming a mask above the first semiconductor region and performing a second implantation sequence including at least a second halo implantation in the second semiconductor region to increase the threshold voltage of the field effect transistors to be formed in and above the second semiconductor region and removing the mask.

A further illustrative method disclosed herein relates to forming a first gate electrode structure on a first semiconductor region, a second gate electrode structure on a second semiconductor region and a third gate electrode structure on a third semiconductor region. The method further includes performing a first implantation sequence including at least a source and drain extension implantation and a first halo implantation in the first, second and third semiconductor regions. The method further includes forming a first resist mask above the first semiconductor region, performing a second implantation sequence including at least a second halo implantation in the second and third semiconductor regions and removing the first resist mask. The method further includes forming a second resist mask above the third and second semiconductor regions and performing a third implantation sequence including at least a third halo implantation in the third semiconductor region and removing the second resist mask.

A further illustrative method disclosed herein relates to providing a first semiconductor region and a second semiconductor region and performing a first implantation sequence implanting a first dose of an ion species in the first and second semiconductor regions. The method further including forming a mask above the first semiconductor region and performing a second implantation sequence implanting a second dose of the ion species in the second semiconductor region, while the first semiconductor region is covered by the mask.

BRIEF DESCRIPTION OF THE DRAWINGS

The disclosure may be understood by reference to the following description taken in conjunction with the accompanying drawings, in which like reference numerals identify like elements, and in which:

FIGS. 1*a*-1*e* schematically illustrate cross-sectional views of a semiconductor device during various manufacturing stages in implanting source and drain extension regions and halo regions, according to a conventional process strategy;

FIGS. 2*a*-2*f* schematically illustrate cross-sectional views of a semiconductor device during various manufacturing stages when performing source and drain extension regions and accompanying implants, according to an embodiment; and FIGS. 3*a*-3*c* schematically illustrate cross-sectional views of a semiconductor device comprising transistors with three different threshold voltages, according to a further embodiment.

Figure 1A:
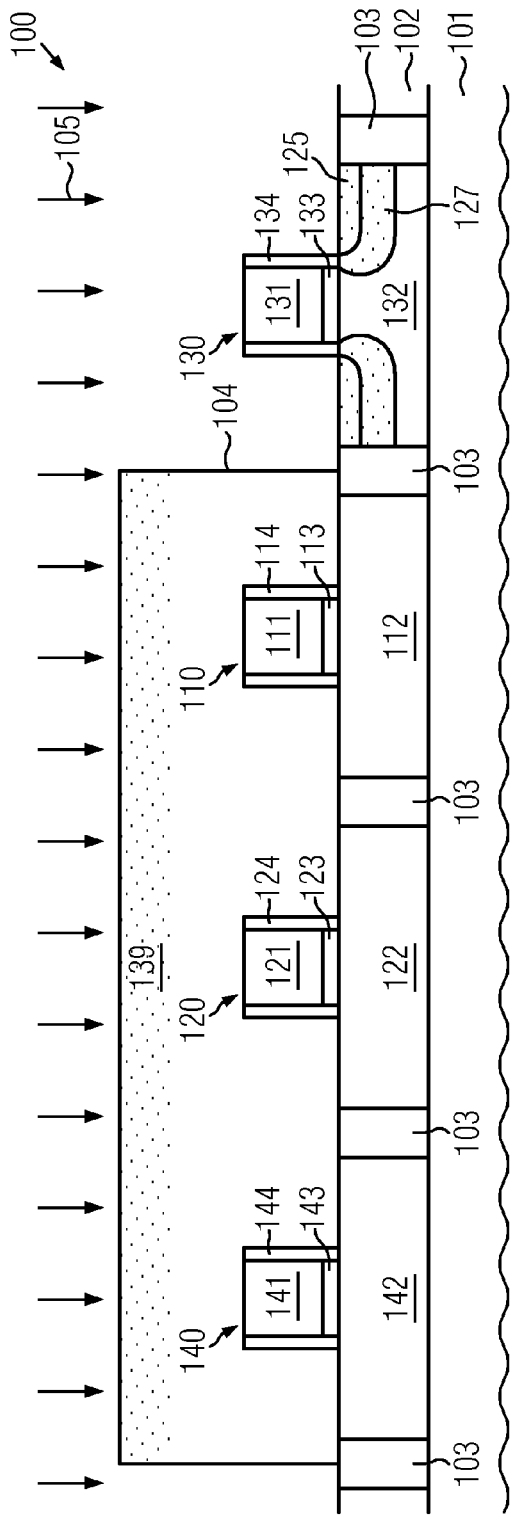
Figure 1B:
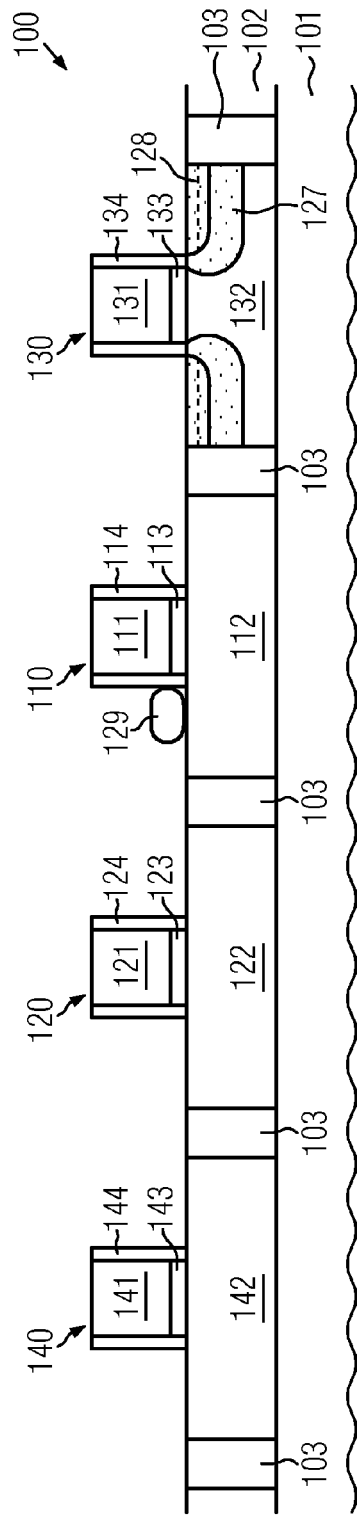
Figure 1E:
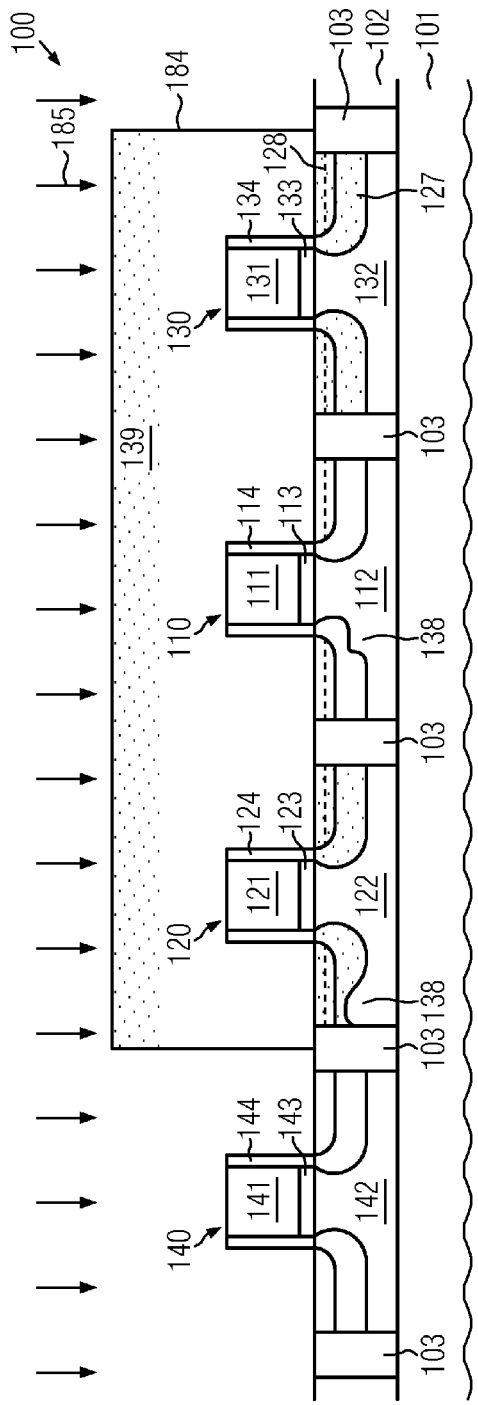

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure contemplates manufacturing techniques in which superior process reliability leads to an improved production yield and a reduced number of process steps leads to an increased throughput in an available manufacturing environment. To this end, implantation processes that are performed for different transistors on the basis of different ion doses may be performed by a combination of a common base implantation and a further add-on implantation. The add-on implantation may be performed in some of the transistors receiving the common base implantation. In illustrative embodiments, semiconductor devices including transistors with different threshold voltages are formed. The different threshold voltages of transistors of the same conductivity type are substantially defined by employing different halo implantations. As other implantation processes performed typically in the same manufacturing step, such as pre-amorphization, source and drain extension implantation and extra-diffusion engineering implantations, may be identical for different threshold voltages, these implantations in combination with a common halo base implantation may be performed for all transistors of the same conductivity type in a common implantation sequence. Higher threshold voltages of specific transistors, such as, for example, transistors of memory elements or input-output transistors, may subsequently be achieved by an add-on low dose halo implantation, while the other transistors are covered by a resist mask. Thus, the amount of atoms implanted in the required resist masks is reduced, compared to a conventional manufacturing process, so that removal of the resist masks is facilitated compared to conventional techniques as ions conventionally implanted in the resist mask in a high concentration may adversely affect the resist removal process as described with reference to FIGS. 1a-1e. As less residuals of the resist may remain on the wafer surface and material loss may be reduced, subsequently performed manufacturing process steps may be performed more reliably, and device performance and/or production yield may be increased.

Furthermore, the technique of performing a base implantation sequence and add-on implantations may reduce the number of required implantation steps, when the base implantation sequence comprises non-varying common implantations, e.g., for pre-amorphization, source and drain extension implantations and extra diffusion engineering, in addition to the varying halo implantations, as the non-varying implantations may be performed in a common implantation for different transistors. The reduced number of implantation steps may lead to an increased throughput in an available manufacturing environment.

With reference to FIGS. 2a-2f and 3a-3c, further illustrative embodiments will now be described in more detail, wherein reference may also be made to FIGS. 1a-1e, if appropriate.

Figure 2A:
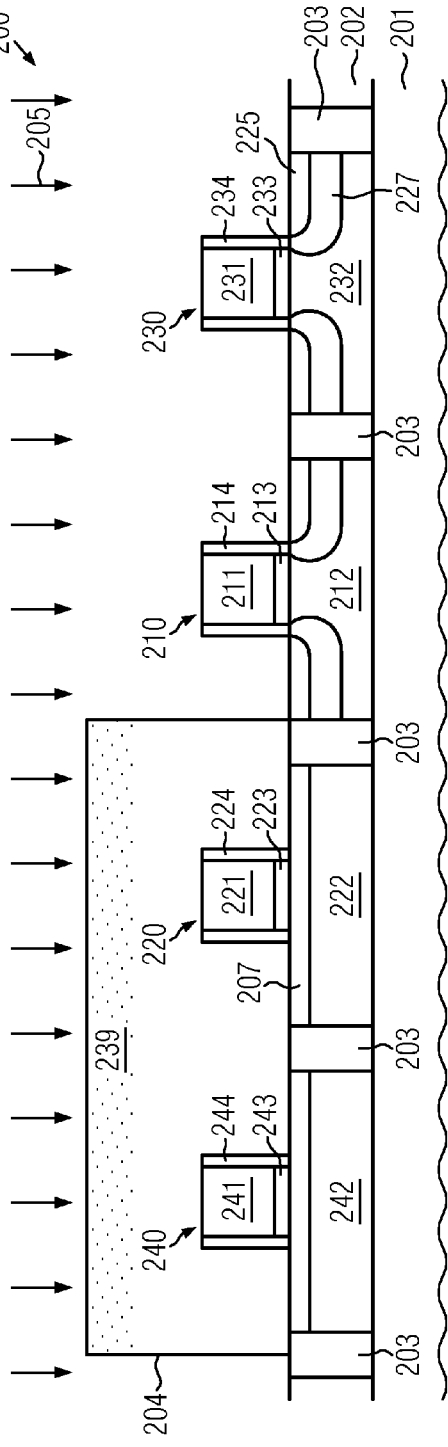

FIG. 2a schematically illustrates a cross-sectional view of a semiconductor device 200 comprising a substrate 201 and a semiconductor layer 202, such as a silicon-based layer, or any other appropriate semiconductor material which may comprise a significant portion of silicon. The semiconductor layer 202 may be formed so as to directly connect to a crystalline semiconductor material of the substrate 201, if a bulk architecture is considered, as shown in FIG. 2a, while, in other cases, a silicon-on-insulator (SOI) architecture may be provided when a buried insulation material (not shown) is formed below the semiconductor layer 202. The layer 202 may be a continuous semiconductor material in an initial state and may be divided into a plurality of active regions, such as active regions 212, 222, 232, 242, by providing appropriate isolation structures 203.

Generally, the isolation region 203 and the active regions 212, 222, 232, 242 may have similar characteristics as is already discussed above with reference to the device 100. Thus, with respect to these components and manufacturing techniques for forming, the same criteria may apply as discussed above.

Moreover, in this manufacturing stage, gate electrode structures 220, 240 may be formed on the active regions 222, 242, respectively, which in some cases may comprise an additional semiconductor material 207 having appropriate electronic characteristics in order to adjust the overall threshold characteristics of transistors still to be formed in and above the active regions 222, 242. In this case, the material 207, for instance provided in the form of a silicon/germanium alloy, may be a part of the active regions 222, 242 whose semiconductor base material may have a different material composition compared to the threshold voltage adjusting material 207. On the other hand, gate electrode structures 210, 230 may be formed above the active regions 212, 232, respectively, wherein a corresponding threshold voltage adjusting semiconductor material may be omitted if a transistor of different conductivity type or generally of different threshold voltage characteristics is to be formed in and above the active regions 212, 232. It should be appreciated, however, that the layer 207 may also be omitted in the active regions 222, 242, depending on the type of transistors to be formed therein.

The gate electrode structures 210, 220, 230, 240 may have any appropriate configuration and may comprise a gate dielectric material 213, 223, 233, 243, which may comprise, in one embodiment, silicon dioxide and/or silicon oxynitride. Silicon dioxide and/or silicon oxynitride based gate dielectric materials may be implemented in transistors having a gate length of 30 nm and less, when the requirements with regard to device performance are moderate. Thus, in this case, a reliable and cost-efficient technique may be provided. In other illustrative embodiments, the gate dielectric material may comprise a high-k dielectric component followed by a metal-containing electrode material. The gate electrode structure may further comprise a silicon-containing semiconductor material 211, 221, 231, 241 followed by a dielectric cap layer or a cap layer system (not shown) as is, for instance, also described above with reference to device 100. In some illustrative embodiments, a spacer structure 214, 224, 234, 244 may be formed on the gate electrode structures 210, 220, 230,

240, wherein, in one illustrative embodiment, the thickness of the spacer structure is appropriate to perform an implantation that may comprise a pre-amorphization, a source and drain extension implantation, extra diffusion engineering implantations and halo implantations. Furthermore, an implantation mask, such as a resist mask 204, may be provided so as to cover the active regions 222, 242 that are provided to obtain source and drain extension implantations of the opposite conductivity type.

The semiconductor device 200 as shown in FIG. 2a may be formed on the basis of the following processes. After providing the substrate 201 having formed thereon the device layer 202, the active regions 212, 222, 232, 242 may be defined, for instance on the basis of the isolation structures 203, which may be formed on the basis of well-established techniques, as are also described with reference to device 100.

In the case of the semiconductor layer 207 having to be provided, for example in high-k applications, an appropriate process sequence may be implemented prior to forming the gate electrode structures, for instance by masking the active regions 212, 232 using any appropriate hard mask material such as silicon dioxide, silicon nitride and the like and selectively growing a desired semiconductor alloy on the base material of the active regions 222, 242, i.e., on the semiconductor material of the initial semiconductor layer 202.

Thereafter, implantation processes may be performed for establishing a vertical profile within the active regions 212, 222, 232, 242 if required. Thereafter, the gate electrodes 210, 220, 230, 240, including the spacer structures 214, 224, 234, 244 and the gate insulation layers 213, 223, 233, 243, may be formed on the basis of process techniques as previously described with reference to the semiconductor device 100, when respective transistor elements are to be formed in the active regions 212, 222, 232, 242.

Subsequently, the device 200 may be subjected to an ion implantation sequence 205 on the basis of appropriate process parameters, wherein typically a high dose is to be used in order to obtain a high dopant concentration in the implant region 225 as required by design rules. For instance, the implant region 225 may represent an extension region of drain and source regions of a transistor device to be formed in the active regions 212 and 232, thereby requiring a dopant concentration in the range of approximately $1 \times 10^{19}$ to $1 \times 10^{20}$ atoms per cm$^3$ and even higher, which may require implantation doses of approximately $1 \times 10^{15}$ atoms per cm$^2$ and even significantly higher. Thus, a high-dose implantation process is to be understood as an implantation process performed on the basis of an implantation dose of at least $5 \times 10^{14}$ atoms per cm$^2$. Since the average penetration depth is moderately low in order to obtain shallow PN junctions in the vicinity of the gate electrode 210, 230 when sophisticated transistor elements are considered, extremely low implantation energies of approximately 10 keV and significantly less or even 3 keV and less may be used. The implantation sequence 205 further comprises a halo base implantation that may be implanted by a tilted and/or non-tilted implantation with an ion species generating the opposite conductivity type than the source/drain implantation species. The dose of the base halo implantation is chosen to provide a halo concentration appropriate to adjust the threshold voltage of a transistor formed in and above the active region 212, which is, in one embodiment, a transistor having a low threshold voltage. The dose of the base halo implantation is typically approximately in the range of $5 \times 10^{12}$ atoms per cm$^2$ to $5 \times 10^{13}$ atoms per cm$^2$. More typically, the base implantation is approximately $1 \times 10^{13}$ atoms per cm$^2$.

The implantation sequence 205 may further comprise a pre-amorphization implantation step that is performed prior to the source/drain extension and halo implantation steps to provide an amorphous portion in the active region in which the ions are to be implanted to reduce the channeling effect that might adversely affect the accuracy of implantation steps performed in crystalline materials. Thus, the pre-amorphization implantation may help to define the implanted region more accurately. The pre-amorphization implantation is performed with an ion species that provides a substantial amorphization effect with a low dose and does not substantially affect the electronic characteristic of the implanted region. Typically, the pre-amorphization implantation may be performed with a high dose, depending on the requirements, wherein xenon may provide an appropriate ion species. Alternatively, germanium may be employed as an ion species for the pre-amorphization step, if the corresponding modification of the electrical characteristic of the implanted region is desired.

Furthermore, in illustrative embodiments, an additional diffusion engineering implantation step may be performed to control diffusion of the implanted source and drain extension dopant during the subsequently performed annealing steps. The diffusion engineering implantation step is typically performed by implanting fluorine, carbon and/or nitrogen with a dose which is in the range of approximately $1 \times 10^{14}$ to $1 \times 10^{16}$ atoms per cm$^2$. More preferably, the dose is approximately $2 \times 10^{15}$ atoms per cm$^2$. The implantation energy is typically in the range of approximately 10-100 keV and more typically in the range of approximately 20-50 keV.

The source and drain extension implantation and the halo base implantation and, in case the pre-amorphization and diffusion engineering implantation steps have been performed, the corresponding ions are also incorporated in the implant region 239 of the resist mask 204 covering the active regions 222 and 242.

FIG. 2b schematically illustrates the device 200 in a further advanced process stage in which the resist mask 204 (FIG. 2a) is removed from the active regions 222 and 242. As previously discussed, the implant species incorporated in the implantation sequence 205 into the resist mask 204 may impede the resist removal, so that the device 200 may exhibit a material loss indicated by the dashed line 228 in the active regions 212 and 232 and resist residuals 229 may remain on the substrate surface, e.g., in the active regions 222 and 242. In an appropriate removal process, however, a single resist removal process may be optimized to achieve a moderate material loss and a low count of resist residuals resulting in an acceptable device performance and production yield. Furthermore, removal of the "contaminated" upper portion of the resist layer may be additionally enhanced by performing a polishing process in order to enhance the efficiency of the subsequent resist strip process, which may include a plasma-based process and/or a wet chemical etch process with high selectivity with respect to the substrate material.

FIG. 2c schematically illustrates the device 200 after forming a resist mask 264 covering the active regions 212, 222, 242 and exposing the active region 232. In an add-on halo implantation 265, additional ions of the halo implantation species employed in the base halo implantation step of the previously performed implantation sequence 205 are implanted into the active region 232 to adjust the threshold voltage of the transistor to be formed in and above the active region 232. In case the dielectric gate layers 213 and 233 of the gate electrode structures 210 and 230, respectively, comprise the same material and have the same thickness, the add-on implantation 265 increases the threshold voltage of the transistor to be formed in and above the active region 232. The additionally implanted halo atoms increase the halo concentration in the active region 232, as indicated by the dotted region 237, providing a steeper PN junction formed therein. The halo implantation 265 may also be performed by a tilted and/or non-tilted implantation. The implantation dose is typically lower than the dose of the base halo implantation and is, in one embodiment, approximately $1 \times 10^{13}$ atoms/cm$^2$ and less. In one embodiment, the add-on halo implantation may have an implantation dose that is one fifth and less than the dose of the corresponding base implantation step. In one embodiment, the gate dielectric layer 233 may have a greater thickness than the gate dielectric layer 213 to provide a decreased leakage current. The required adaptation of the threshold voltage may also be accounted for in the add-on halo implantation.

FIG. 2d schematically illustrates the device 200 after removal of the resist mask 264 (FIG. 2c). The additional material loss in the active region 232 caused by the removal of the resist mask 264 is low as the implanted species incorporated in the resist mask 264 comprises merely the halo implant species with a low concentration so that the resist strip process is substantially not adversely affected by the incorporated atoms. Also the amount of residuals of the resist that may remain on the active regions 212, 222 and 242 may be substantially reduced compared to a conventional manufacturing process due to the substantially reduced resist "contamination."

FIG. 2e schematically illustrates the device 200 after forming a further resist mask 274 covering the active regions 212 and 232 and exposing the active regions 222 and 242. A second implantation sequence 275 comprising at least a source and drain extension implantation step and a base halo implantation step as described with reference to FIG. 2a is performed. The dose of the base halo implantation is chosen to provide a halo concentration appropriate to adjust the threshold voltage of a transistor formed in and above the active region 242, which is, in one embodiment, a transistor having a low threshold voltage. Compared to the first implantation sequence 205 (FIG. 2a), the ion species implanted in the second implantation sequence 275 generates the opposite conductivity type so that P-type dopants may be implanted in the active regions 222 and 242 when the source and drain extension implant species implanted in the active regions 212 and 232 form N-type regions. In this case, the halo base implantation step of the implantation sequence 275 is performed by implanting an N-type species. Thus, in this case, P-channel transistors may be formed in and above the active regions 222 and 242 and N-channel transistors may be formed in and above the active regions 212 and 232. In addition, the implantation sequence 275 may comprise a pre-amorphization implantation and a diffusion engineering implantation as described with regard to FIG. 2a. Subsequently, the resist mask 274 may be removed and, as discussed with regard to FIG. 2b, the removal may be impeded due to the implant species incorporated by the performed high-dose implantation steps in the implant region 239 of the resist mask 274. As the corresponding material loss caused in the active regions 222 and 242 which are not affected in the first resist removal step may be moderate, the influence on the production yield and on the device performance may be maintained in an acceptable range.

FIG. 2f schematically illustrates the device 200 after removal of the resist mask 274 (FIG. 2e) and after formation of a further resist mask 284 formed above the active regions 212, 232 and 242 and exposing active region 222. A further add-on halo implantation step 285 is performed as described with regard to the add-on halo implantation 265 shown in FIG. 2c, but with an ion species providing an opposite conductivity type in the halo region 237. The add-on halo implantation 285 may be performed to adjust the threshold voltage of a transistor to be formed in and above the active region 222.

The resist mask 284 may be removed substantially without further material loss in the active region 222 and a significantly reduced amount of residuals of the resist on the active regions 212, 232 and 242. Thus, transistor performance and production yield may be significantly improved compared to conventional implantation schemes.

Furthermore, the number of the performed implantation steps is reduced so that the throughput of the employed manufacturing environment may be increased. The number of implantation steps according to the present disclosure amounts to 10 in case the first and the second implantation sequences comprise, in addition to source and drain extension and halo implantation steps, pre-amorphization and diffusion engineering implantation steps, respectively, whereas corresponding implantation sequences performed according to a conventional technique as described with reference to FIGS. 1a-1e amount to 16.

Figure 3B:
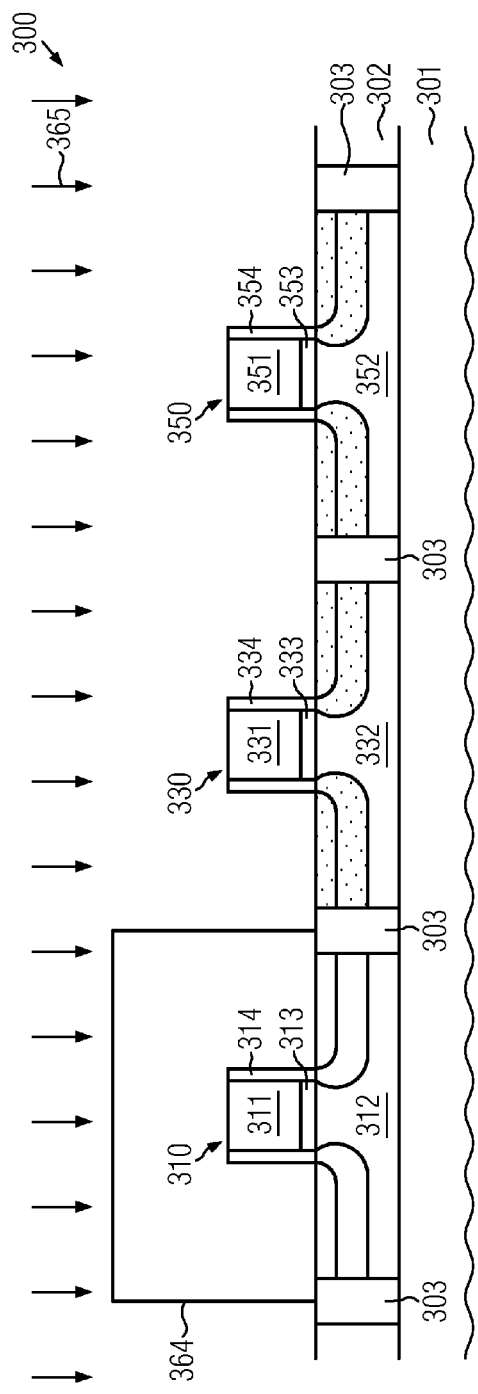
Figure 3C:
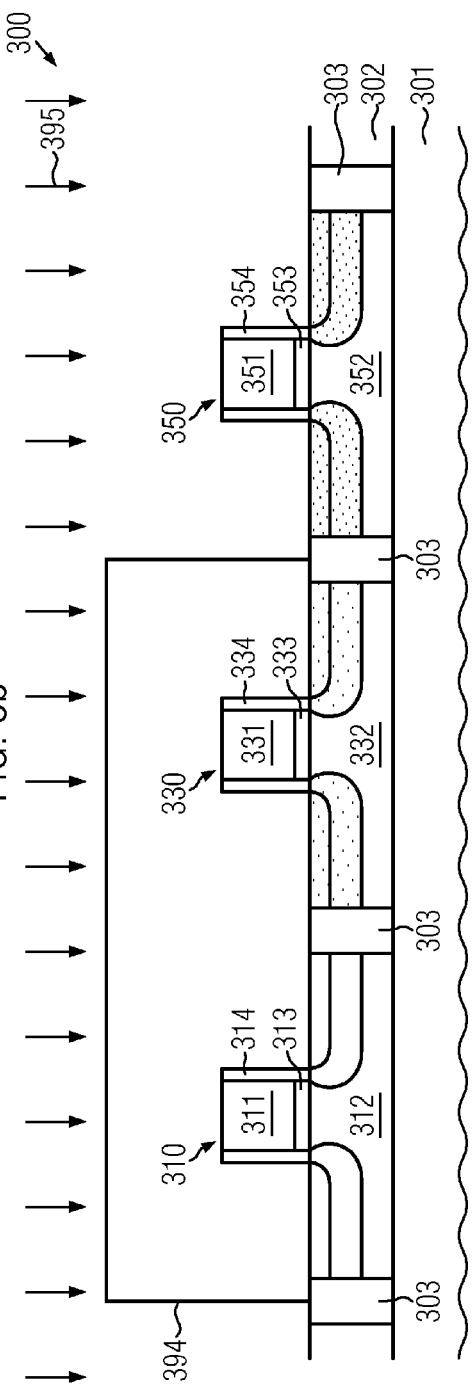

With reference to FIGS. 3a-3c, further illustrative embodiments of the present invention will now be described in more detail, in which transistors of the same conductivity type having a low, standard or high threshold voltage may be formed.

FIG. 3a schematically illustrates a cross-sectional view of semiconductor device 300 comprising a substrate 301 having formed thereon a device layer 302, such as a semiconductor layer and the like. Furthermore, a first active region 312, a second active region 332 and a third active region 352 may be defined, for instance on the basis of respective isolation structures 303. A first gate electrode 310, a second gate electrode 330 and a third gate electrode 350, including sidewall spacer structures 314, 334, 354 and corresponding gate insulation layers 313, 333, 353, may be provided in the respective active areas 310, 330, 350, wherein for these components substantially the same criteria may apply as previously described with reference to the devices 200 and 100. The active areas 312, 332, 352 are prepared to form transistors of the same conductivity type therein, i.e., the active areas 312, 332, 352 may, for example, be subjected to the same well implantation sequence. In case a corresponding CMOS device is contemplated, the device 300 may comprise complementary transistors (not shown) having correspondingly adapted different threshold voltages.

A first implantation sequence 305 comprising at least a source and drain extension implantation and a base halo implantation in the active areas 312, 332 and 352 to form at least source and drain extension regions 325 and halo regions 327, as previously discussed with regard to device 200, is performed. The base halo implantation is performed with a dose and an implantation energy that is appropriate, for example, for a transistor to be formed in the active region 312, which may be appropriate for transistors having a low threshold voltage. The first implantation sequence 305 may further comprise a pre-amorphization and/or a diffusion engineering implantation, as previously described with reference to device 200. During the first implantation sequence 305, if necessary, other device regions (not shown) comprising, e.g., complementary transistors of a CMOS device may be covered by a resist mask (not shown) which may be formed and removed as described with reference to the resist mask 204 of FIG. 2a.

FIG. 3b schematically illustrates the semiconductor device 300 in a further advanced manufacturing stage in which a resist mask 364 is formed above the first active region 312 so that the second active region 332 and the third active region 352 are exposed. The resist mask 364 may be formed by well-established manufacturing techniques using spinon deposition and lithography. A second implantation sequence 365 is performed comprising at least a low-dose add-on halo implantation that is appropriate to adjust the threshold voltage of a transistor to be formed in and above the second active region 332, as previously described with regard to device 200. In one embodiment, the add-on halo implantation may have an implantation dose that is less than the dose of the corresponding base implantation step. More typically, in one embodiment, the add-on halo implantation may have an implantation dose that is one fifth and less than the dose of the corresponding base implantation step.

Subsequently, the resist mask 364 is removed and, due to the reduced incorporation of implantation species, the removal may be performed without any substantial material loss in the exposed active regions 332, 352 and without undue amount of resist residuals.

FIG. 3c schematically illustrates the semiconductor device in a further advanced manufacturing stage in which a resist mask 394 is formed above the first active region 312 and above the second active region 332, wherein the third active region 352 is exposed. A third implantation sequence 395 comprising at least a further add-on halo implantation is performed to adjust the threshold voltage of a transistor to be formed in and above the third active area 352. The implantation dose of the additional add-on halo implantation of the third implantation sequence 395 may be less than the base implantation dose of the base halo implantation step of the first implantation sequence 305. The resist mask 394 may be subsequently removed, wherein the removal is again facilitated due to the reduced amount of incorporated implantation atoms. Thus, transistor performance and production yield may be significantly improved compared to conventional implantation schemes.

The number of implantation steps for providing, e.g., N-channel-transistors with low, standard and high threshold voltages according to the present disclosure amounts to 6 in case the first and the second implantation sequences comprise, in addition to source and drain extension and halo implantation steps, pre-amorphization and diffusion engineering implantation steps, respectively, whereas corresponding implantation sequences performed according to a conventional technique amount to 12. Thus, the throughput of an employed manufacturing environment may be increased.

As a result, the present disclosure provides manufacturing techniques for forming semiconductor devices including transistors with different threshold voltages. The different threshold voltages of transistors of the same conductivity type are substantially defined by implanting halo regions with different dopant concentrations. As other implantations performed typically in the same manufacturing step, such as pre-amorphization, source and drain extension implantations and extra diffusion engineering implantations, may be identical for different threshold voltages, these implantations in combination with a common halo base implantation may be performed for all transistors of the same conductivity type in a common implantation sequence. Higher threshold voltages of specific transistors may subsequently be achieved by an add-on low-dose halo implantation while the other transistors are covered by a resist mask. Due to the employment of low-dose implantation processes, the amount of atoms of the implant species incorporated in the resist mask is reduced so that removal of the resist masks is facilitated compared to conventional implantation regimes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming field effect transistors with different threshold voltages, the method comprising:
   forming a first gate electrode structure on a first semiconductor region;
   forming a second gate electrode structure on a second semiconductor region;
   performing a first implantation sequence comprising at least a source and drain extension implantation and a first halo implantation in said first and second semiconductor regions;
   forming a mask above said first semiconductor region;
   performing a second implantation sequence comprising at least a second halo implantation in said second semiconductor region to increase the threshold voltage of a field effect transistor to be formed in and above said second semiconductor region; and
   removing said mask.

2. The method of claim 1, wherein said first gate electrode structure and said second gate electrode structure comprise the same gate insulation material.

3. The method of claim 2, wherein said gate insulation material comprises at least one of silicon dioxide and silicon oxynitride.

4. The method of claim 1, wherein said first implantation sequence further comprises at least one of a pre-amorphization implantation and a diffusion engineering implantation.

5. The method of claim 1, wherein said first halo implantation is performed with a dose in the range of approximately $5 \times 10^{12}$ atoms/cm$^2$ to $5 \times 10^{13}$ atoms/cm$^2$.

6. The method of claim 1, wherein said second halo implantation is performed with a dose that is less than the dose of said first halo implantation.

7. The method of claim 1, further comprising:
   forming a third gate electrode structure on a third semiconductor region;
   performing a third implantation sequence comprising at least a third halo implantation in said third semiconductor region; and wherein
   said first and second implantation sequences are further performed in said third semiconductor region.

8. The method of claim 7, wherein said third halo implantation is performed with a dose that is less than the dose of said first halo implantation.

9. The method of claim 1, further comprising:
   forming a fourth gate electrode structure on a fourth semiconductor region; and
   forming a fifth gate electrode structure on a fifth semiconductor region.

10. The method of claim 9, wherein performing a first implantation sequence further comprises:
    forming a resist mask covering said third and fourth semiconductor regions and exposing said first and second semiconductor regions prior to performing said first implantation sequence; and removing said resist mask after performing said implantation sequence.

11. The method of claim 9, further comprising:
forming an N-channel transistor on each of said first and second semiconductor regions; and
forming a P-channel transistor on each of said fourth and fifth semiconductor regions.

12. The method of claim 7, wherein at least one of a gate length defined by said first, second and third gate electrode structures is approximately 30 nm and less.

13. A method, comprising:
forming a first gate electrode structure on a first semiconductor region;
forming a second gate electrode structure on a second semiconductor region;
forming a third gate electrode structure on a third semiconductor region;
performing a first implantation sequence comprising at least a source and drain extension implantation and a first halo implantation in said first, second and third semiconductor regions;
forming a first resist mask above said first semiconductor region;
performing a second implantation sequence comprising at least a second halo implantation in said second and third semiconductor regions;
removing said first resist mask;
forming a second resist mask above said first and second semiconductor regions;
performing a third implantation sequence comprising at least a third halo implantation in said third semiconductor region; and
removing said second resist mask.

14. The method of claim 13, wherein said first, second and third gate electrode structures comprise the same gate insulation material.

15. The method of claim 14, wherein said gate insulation material comprises at least one of silicon dioxide and silicon oxynitride.

16. The method of claim 13, wherein at least one of a gate length defined by said first, second and third gate electrode structures is approximately 30 nm and less.

* * * * *